US007867337B2

(12) United States Patent
Izumi

(10) Patent No.: US 7,867,337 B2
(45) Date of Patent: Jan. 11, 2011

(54) SUBSTRATE PROCESSING METHOD AND SUBSTRATE PROCESSING APPARATUS

(75) Inventor: Akira Izumi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 1070 days.

(21) Appl. No.: 11/567,452

(22) Filed: Dec. 6, 2006

(65) Prior Publication Data

US 2007/0131246 A1 Jun. 14, 2007

(30) Foreign Application Priority Data

Dec. 13, 2005 (JP) ............................ 2005-358866

(51) Int. Cl.
*B08B 7/00* (2006.01)
*B08B 7/04* (2006.01)
(52) U.S. Cl. .................. 134/4; 134/5; 134/26; 134/30; 134/33; 134/61; 134/63; 134/105; 134/137; 134/902
(58) Field of Classification Search ............... 134/4, 134/5, 26, 30, 32, 33, 34, 61, 63, 105, 137, 134/172, 198, 199, 902
See application file for complete search history.

(56) References Cited

U.S. PATENT DOCUMENTS

| 4,817,652 | A | | 4/1989 | Liu et al. | |
|---|---|---|---|---|---|
| 4,883,775 | A | * | 11/1989 | Kobayashi | 134/4 |
| 4,962,776 | A | * | 10/1990 | Liu et al. | 134/11 |
| 5,857,474 | A | * | 1/1999 | Sakai et al. | 134/102.3 |
| 5,975,098 | A | * | 11/1999 | Yoshitani et al. | 134/148 |
| 6,051,101 | A | * | 4/2000 | Ohtani et al. | 156/345.32 |
| 6,783,599 | B2 | * | 8/2004 | Gale et al. | 134/1 |
| 7,410,545 | B2 | * | 8/2008 | Matsubara | 134/33 |
| 2007/0221254 | A1 | * | 9/2007 | Izumi et al. | 134/26 |
| 2007/0235062 | A1 | * | 10/2007 | Fujiwara et al. | 134/4 |
| 2008/0121251 | A1 | * | 5/2008 | Miya et al. | 134/4 |
| 2008/0121252 | A1 | * | 5/2008 | Miya | 134/4 |

FOREIGN PATENT DOCUMENTS

| JP | 62-169420 | | 7/1987 |
|---|---|---|---|
| JP | 64-9624 | | 1/1989 |
| JP | 2-10831 | | 1/1990 |
| JP | 3-503975 | | 9/1991 |
| JP | 3-261142 | | 11/1991 |
| JP | 03261142 A | * | 11/1991 |
| JP | 4-134822 | | 5/1992 |

(Continued)

*Primary Examiner*—Alexander Markoff
(74) *Attorney, Agent, or Firm*—Ostrolenk Faber LLP

(57) ABSTRACT

A substrate having a liquid film formed by pre-processing unit is transported by a substrate transport robot from the pre-processing unit to a freeze processing unit disposed away from the pre-processing unit. In the freeze-processing unit, the liquid film is frozen. This causes the adhesion power of contaminants adhering to the surface of the substrate reduce, and therefore the contaminants is detached from the surface of the substrate. Subsequently, the substrate which was subjected to the freezing process, is transported from the freeze processing unit to a post-processing unit which is disposed away from the pre-processing unit and the freeze processing. In the post-processing unit, a cleaning liquid is supplied to the frozen film on the rotating substrate, thereby easily removing the contaminants adhering to the substrate together with the frozen film.

11 Claims, 7 Drawing Sheets

FOREIGN PATENT DOCUMENTS

| | | |
|---|---|---|
| JP | 11-31673 | 2/1999 |
| JP | 11-329922 | 11/1999 |
| JP | 2000-135475 | 5/2000 |
| JP | 3654923 | 3/2005 |
| KR | 1998-079544 | 11/1998 |

* cited by examiner

F I G. 8
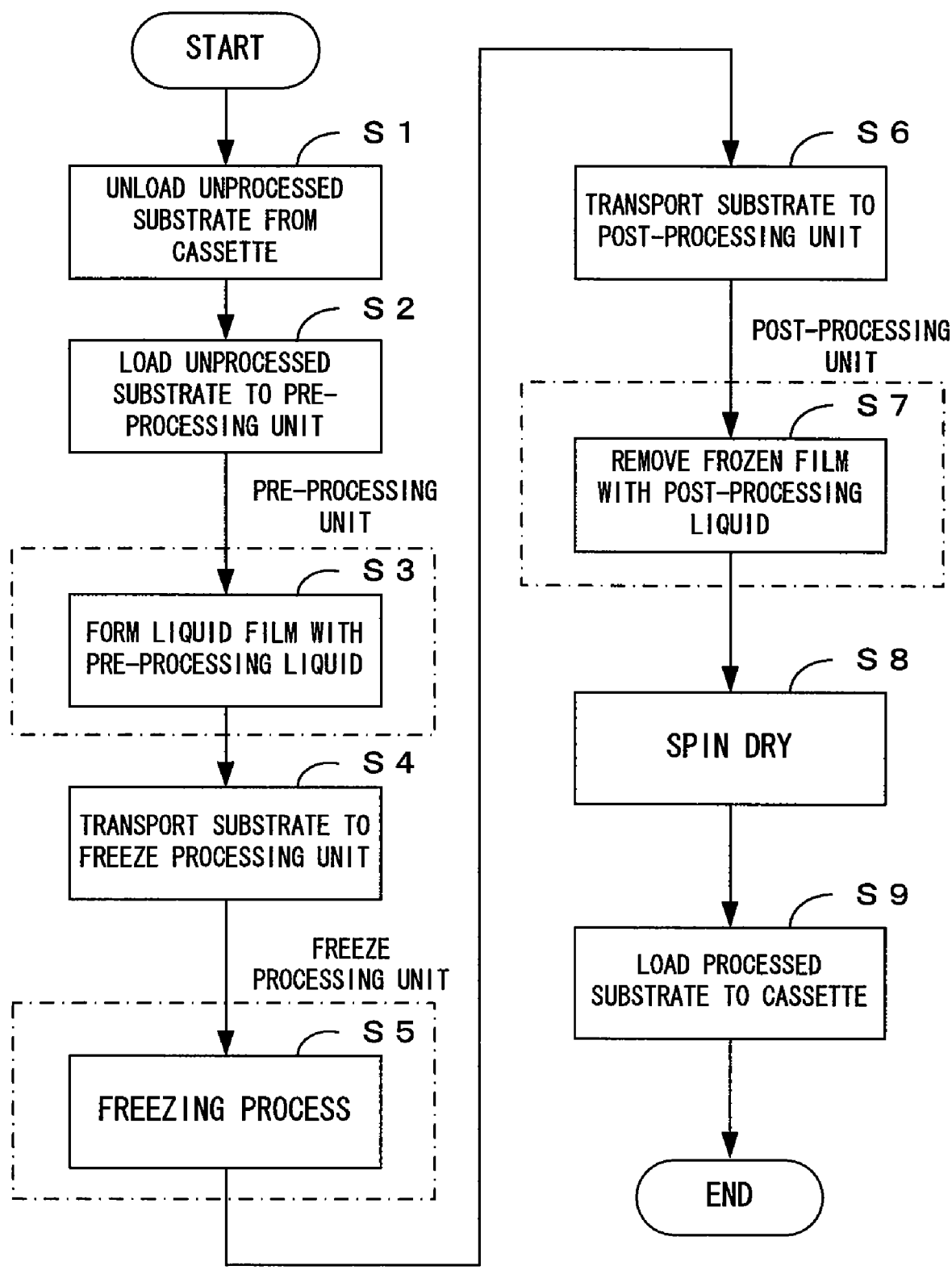

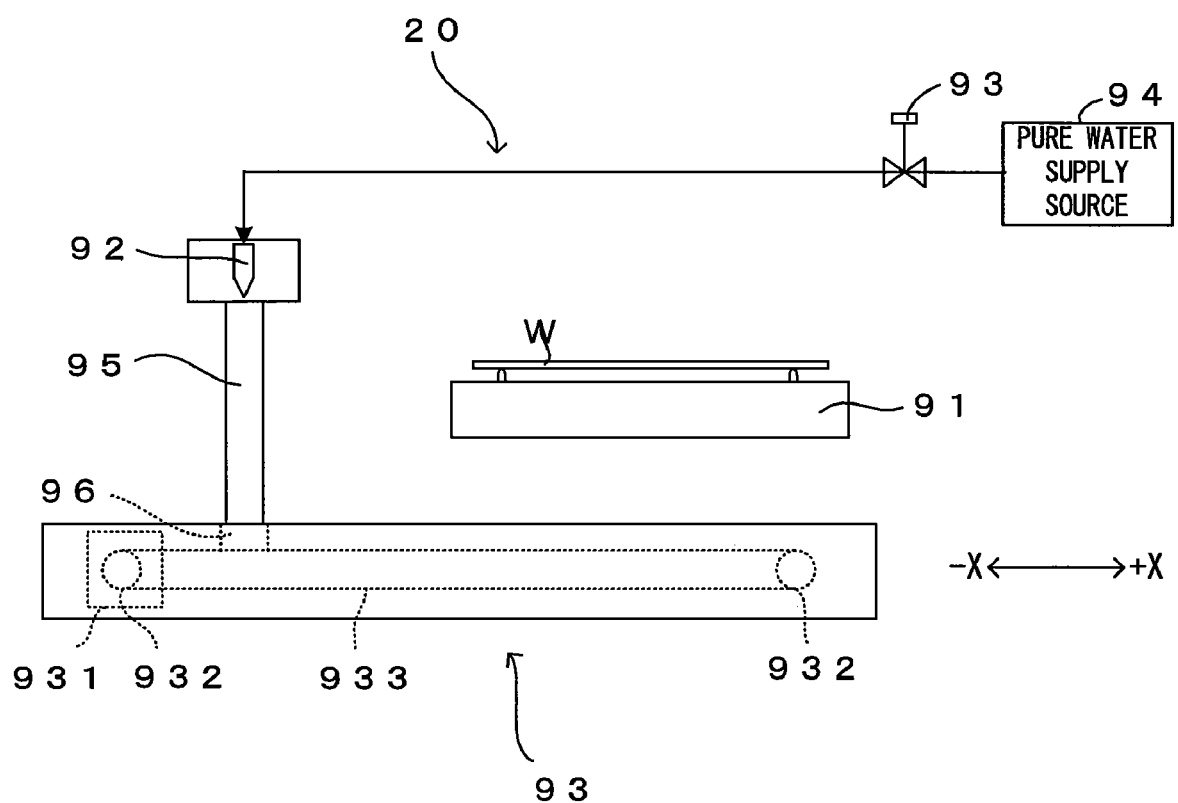
F I G. 9

SUBSTRATE PROCESSING METHOD AND SUBSTRATE PROCESSING APPARATUS

CROSS REFERENCE TO RELATED APPLICATION

The disclosure of Japanese Patent Application No. 2005-358866 filed Dec. 13, 2005 including specification, drawings and claims is incorporated herein by reference in its entirety.

BACKGROUND OF THE INVENTION

1. Field of the Invention

The present invention relates to a substrate processing apparatus and a substrate processing method for cleaning substrates of various types (hereafter called "substrate") such as semiconductor wafers, substrates for liquid crystal displays, substrates for plasma displays, substrates for FED (Field Emission Display), optical disc substrates, magnetic disc substrates, magnetic optical disc substrates and substrates for photo masks.

2. Description of the Related Art

Devices typified by semiconductors are growing more fined, higher performed and high precise, it becomes increasing difficult to remove fine contaminants such as foreign substances and particles adhering to a surface of a substrate without destroying patterns formed on the surface of the substrate. As a solution to this problem, following method is currently proposed. In this method, at first, a liquid film is formed on the substrate by applying liquid to the substrate. Next, the liquid film is frozen on the substrate so that the contaminants adhering to the substrate detach from the surface of the substrate. At last, the liquid film (frozen film) is removed from the substrate, thereby the contaminants is easily removed from the surface of the substrate. Following literatures exist as prior art documents: JP-A-11-31673; JP-A-3-503975; JP-A-3-261142; U.S. Pat. No. 6,783,599; and JP-A-62-169420.

SUMMARY OF THE INVENTION

For executing the cleaning processes described above (liquid film forming process+freezing process+film removing process), a substrate is retained by a retaining means in the cleaning chamber (processing chamber). As the preprocessing process, a liquid film is formed on a surface of the substrate by supplying liquid to the substrate. Thereafter, chilling gas is fed into the chamber, so that the liquid film is frozen. Further, in order to remove the frozen liquid film (frozen film), a post-processing process is performed. In particular, liquid such as warm water is supplied to the substrate retained by the retaining means in the same cleaning chamber, and therefore defrosts and removes the frozen film.

However, the foregoing method, wherein the cleaning process is executed within the same cleaning chamber, has encountered the following problems. In the event that the frozen film is removed from the substrate, cool energy retained by the substrate retaining means as well as the substrate itself, has hampered defrosting process to proceed easily. Hence, it is difficult to promptly remove contaminants adhering to the substrate together with the frozen film. On the other hand, the liquid film could not be frozen promptly when the temperature of the retaining means is high.

As the cleaning process is continuously performed in the production process, a sequence of freezing and defrosting processes for the substrate as well as the retaining means is repeated. This is not efficient from the standpoint of both energy efficiency and throughput. That is, in the event that the sequence of cleaning processes are executed within the same cleaning chamber, the temperature of not only the substrate but also the retaining means need to be raised and lowered in sequence (heating and cooling energy need to be provided). This contributes to the problem of decreased productivity.

Moreover, continuous execution of cleaning processes over time causes ice film or ice fragment to stick together and deposit not only on the substrate but also on the retaining means. This sometimes has caused such troubles as deficient substrate retaining function of the retaining means, re-adhesion of the ice film depositing on the retaining means to the substrate already cleaned and the like. There is an apparatus, which comprises liquid supplying means for supplying liquid to a substrate in addition to the chilling means for chilling the substrate. The both means are disposed in the same cleaning chamber. Furthermore, the chilling means and the liquid supplying means may be disposed opposing to the bottom surface of the substrate. This arrangement makes the liquid supplying means chilled, thus causing the risk of failure in supplying liquid to the substrate.

The invention has been made in light of the problems described above, and accordingly, an object of the invention is to provide a substrate processing apparatus and a substrate processing method, that are capable of removing contaminants adhering to a substrate promptly and efficiently.

According to an aspect of the present invention, there is provided a substrate processing apparatus for and a substrate processing method of cleaning a to-be-processed surface of a substrate. The apparatus comprises: a pre-processing unit which applies a preprocessing liquid to form a liquid film of the preprocessing liquid on the to-be-processed surface; a freeze processing unit which is disposed away from the pre-processing unit and freezes the liquid film formed on the to-be-processed surface of the substrate; a post-processing unit which is disposed away from both of the pre-processing unit and the freeze processing unit and supplies a post-processing liquid to the frozen liquid film, thereby removing the liquid film from the to-be-processed surface of the substrate; and a transport unit which transports the substrate between the pre-processing unit and the freeze processing unit and between the freeze processing unit and the post-processing unit. The method comprises: a liquid film forming step of applying a preprocessing liquid to the to-be-processed surface of the substrate by a pre-processing unit so as to form a liquid film of the preprocessing liquid on the to-be-processed surface; a first transport step of transporting the substrate having the liquid film to a freeze-processing unit which is disposed away from the pre-processing unit; a freezing step of freezing the liquid film in the freeze processing unit; a second transport step of transporting the substrate having the liquid film frozen by the freeze processing unit to a post-processing unit which is disposed away from the pre-processing unit and the freeze processing unit; and a film removal step of removing the frozen liquid film by supplying a post-processing liquid to the to-be-processed surface of the substrate in the post-processing unit.

In the present invention, the term "to-be-processed surface" means a surface that is subject to be cleaned. In the event that the cleaning is to be performed only on a single main surface on which devise patterns and such are formed, the single main surface represents "to-be-processed surface" of the invention. If cleaning needs to be performed on the other main surface, the other main surface represents "to-be-processed surface" in the invention. Of course, if the cleaning needs to be performed on both of the main surfaces, as is the case with a double-sided mounting substrate, both of the surfaces represent "to-be-processed surfaces" of the invention.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIG. 8 is a flowchart which shows an operation of the substrate processing apparatus of FIG. 1; and FIG. 9 is a drawing which shows variation of the pre-processing unit to be included in the substrate processing apparatus.

DETAILED DESCRIPTION OF THE PREFERRED EMBODIMENTS

Figure 1:
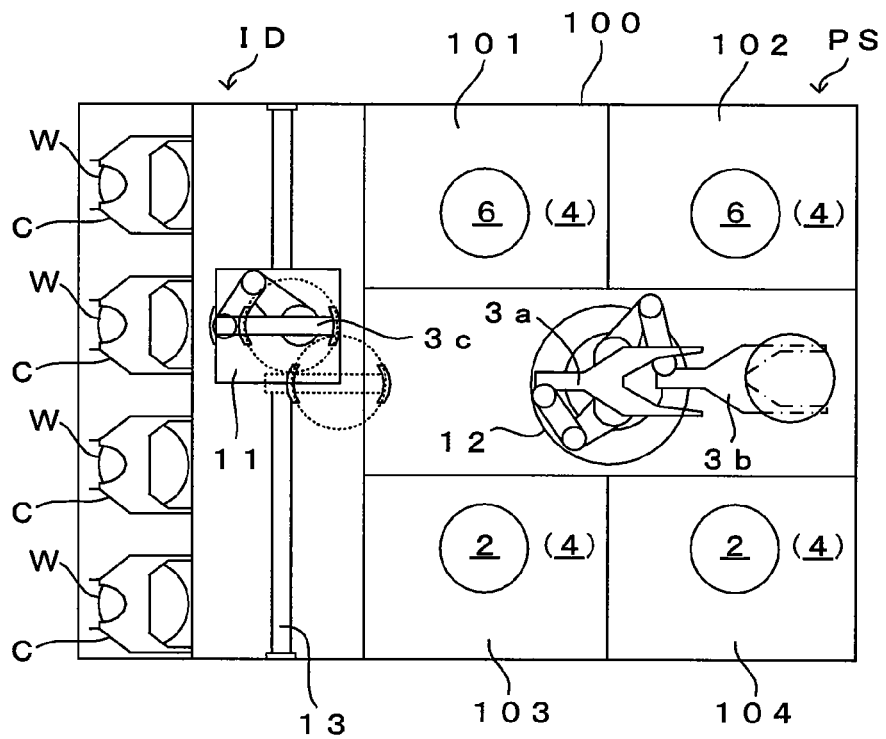
FIG. 1 is a layout plan view which illustrates an embodiment of a substrate processing apparatus according to the present invention.
Figure 2:
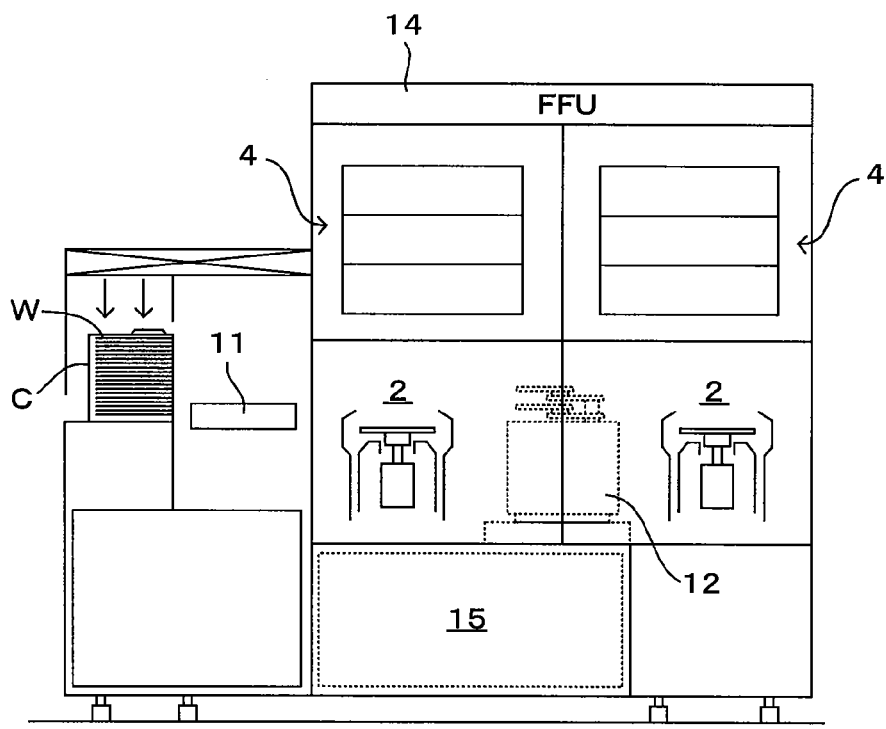
FIG. 2 is a side view of the apparatus of FIG. 1.
Figure 3:
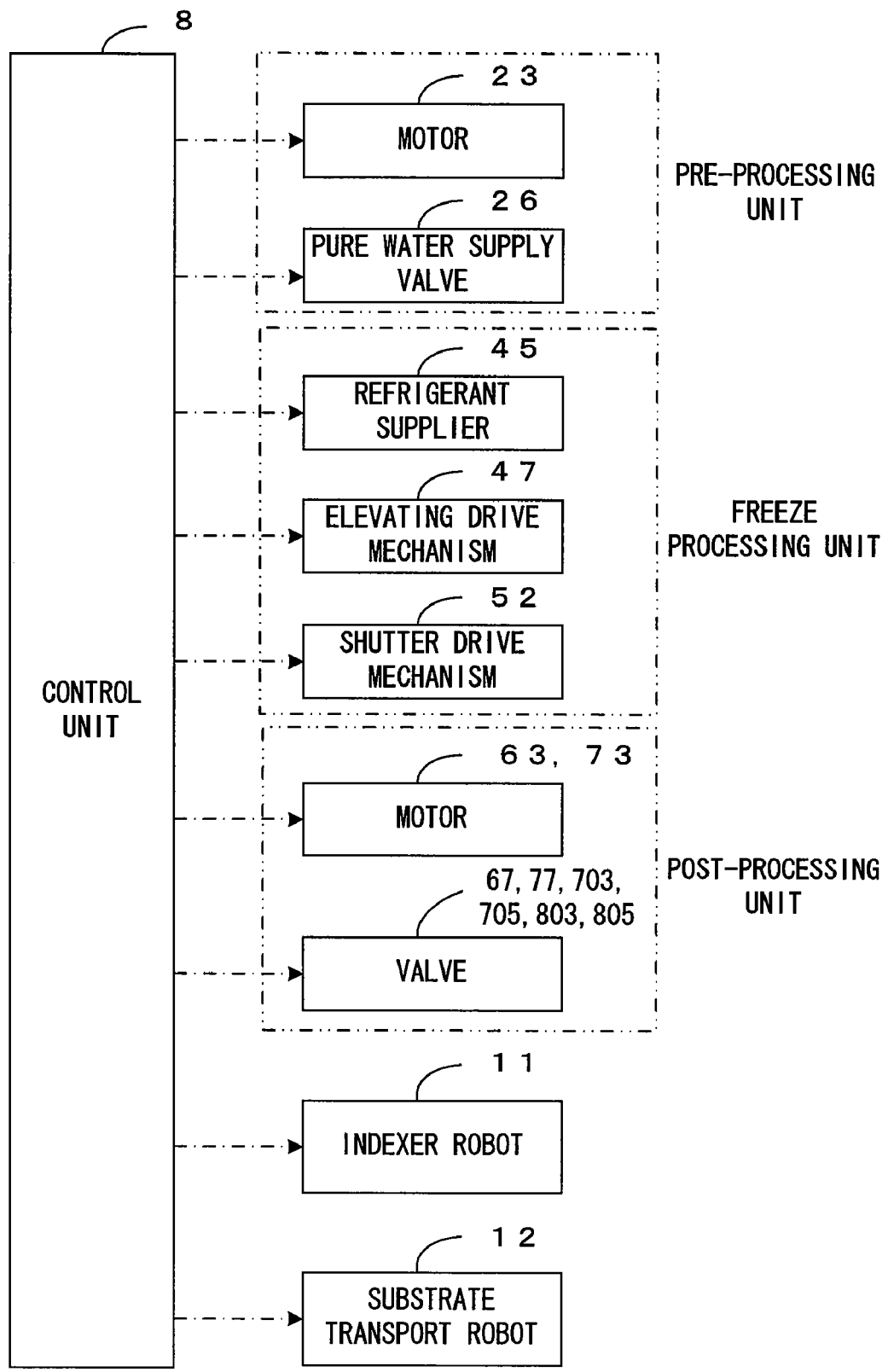
FIG. 3 is a block diagram which shows construction of a main controller.

FIG. 1 is a layout plan view which illustrates an embodiment of a substrate processing apparatus according to the present invention and FIG. 2 is its side view. FIG. 3 is a block diagram which shows construction of a main controller. This substrate processing apparatus is a single-wafer type substrate processing apparatus that is used for the cleaning processes for the purpose of removing contaminants such as particles and various types of metallic impurities adhering to a surface (corresponds to "surface subjected to be processed" in the invention) of a substrate W, such as a semiconductor wafer, or the like. More specifically, this is an apparatus which removes contaminants together with frozen film, by applying a preprocessing liquid to the surface of the substrate on which device patterns are formed, thereby forming a film of the preprocessing liquid, then, freezing said liquid film and supplying post-processing liquid to the liquid film which is already frozen (frozen film).

This substrate processing apparatus includes a substrate processing section PS and an indexer ID connected with the substrate processing section PS. The indexer ID includes an indexer robot 11 which unloads a substrate W to be processed one by one from a cassette C storing a plurality of unprocessed substrates and loads a processed substrate W back to the cassette C. The cassette C can be used FOUP (Front Opening Unified Pod) which stores a plurality of substrate W in sealed condition, SMIF (Standard Mechanical Inter Face) Pod, OC (Open Cassette), or the like. Each of the Cassettes C is provided with a plurality of shelves (not shown) for stacking up and retaining the substrate W, allowing a minimal space in between, with each of the shelf capable of holding one substrate W. Each of the shelves is arranged to be in contact with a circumferential portion of a bottom surface of the substrate W so as to support the substrate W from underneath. Hence, the substrate W is stored in the cassette C in virtually horizontal posture, with its top surface (the surface with device patterns) facing up, and its bottom surface facing down.

The substrate processing section PS includes: a substrate transport robot 12 (corresponds to a "transport unit" of the present invention) which is disposed approximately at the center in plan; and a frame 100 which holds the substrate transport robot 12. The frame 100 is provided with a plurality of (4, according to this embodiment) unit deployment sections 101, 102, 103 and 104, arranged to surround the substrate transport robot 12. The unit deployment sections 101, 102, 103 and 104 are provided with a pre-processing unit 2 for applying the preprocessing liquid to the surface of the substrate W so as to form liquid film (liquid film forming process), and a post-processing unit 6 for supplying a post-processing liquid to the surface (and bottom surface) of the substrate W so as to remove frozen film (film removal step). A plurality of freezing process units 4 for freezing the liquid film (freezing process) applied to the substrate W are disposed above the pre-processing unit 2 and/or post-processing unit 6. Further, a fan filter unit (FFU) 14 is mounted on the ceiling of the substrate processing section PS to blow down clean and fresh air to each of the processing units and the substrate transport robot 12. A cabinet 15 or the like is mounted under the substrate processing section PS for storing chemical liquid tanks, pipes and the like (FIG. 2).

According to this embodiment, two of the pre-processing units 2 and the post-processing units 6 each are disposed to each of the unit deployment sections 101, 102, 103 and 104. When two types of processing units are provided as indicated herein, combination of the pre-processing unit 2 and the post-processing unit 6 can be set in accordance with processing tact time. For instance, it is possible to mount a combination of one pre-processing unit 2 and three post-processing units 6, or a combination of three pre-processing units 2 and one post-processing unit 6. Moreover, the arrangement of the pre-processing unit 2 and post-processing unit 6 can be standardized when a single common liquid is used for preprocessing and post-processing liquids. This standardization will enable deployment of four identical processing units. Further, the arrangement can be made to perform liquid film forming process and film removing process with preprocessing and post-processing liquids, respectively at each processing unit.

Further, in light of the fact that more time is required for freezing process at the freezing process unit 4 than liquid film forming process at the pre-processing unit 2 and film removing process at the post-processing unit 6, greater number of freezing process units may need to be provided in accordance with the process tact time. Hence, only the freezing process units 4 can be stacked in multiple layers to a portion of the unit deployment sections 101, 102, 103 and 104. However, if the multiple layers (for example, 3 layers according to this embodiment) are stacked above the pre-processing unit 2 and/or the post-processing unit 6, the freezing process units can be disposed together with pre-processing unit 2 and post-processing unit 6 at the unit deployment sections 101, 102, 103 and 104. Consequently, saving of the floor space for installation of units, in other word, foot print savings can be achieved.

As described above, the pre-processing unit 2, the freezing process unit 4 and the post-processing unit 6 are disposed away from each other in the substrate processing apparatus. The substrate transport robot 12 transports the substrate W between the pre-processing unit 2 and the freezing process unit 4, and between freezing process unit 4 and post-processing unit 6 within the apparatus, according to an operation command from a control unit 8, which controls the entire apparatus. This substrate transportation enables the execution of a sequence of cleaning processes (liquid film forming process+freezing process+film removing process) within the apparatus. Further, the substrate transport robot 12 operates to receive an unprocessed substrate W from the indexer robot 11 disposed at the indexer ID, as well as handing over a processed substrate W to the indexer robot 11.

Figure 4:
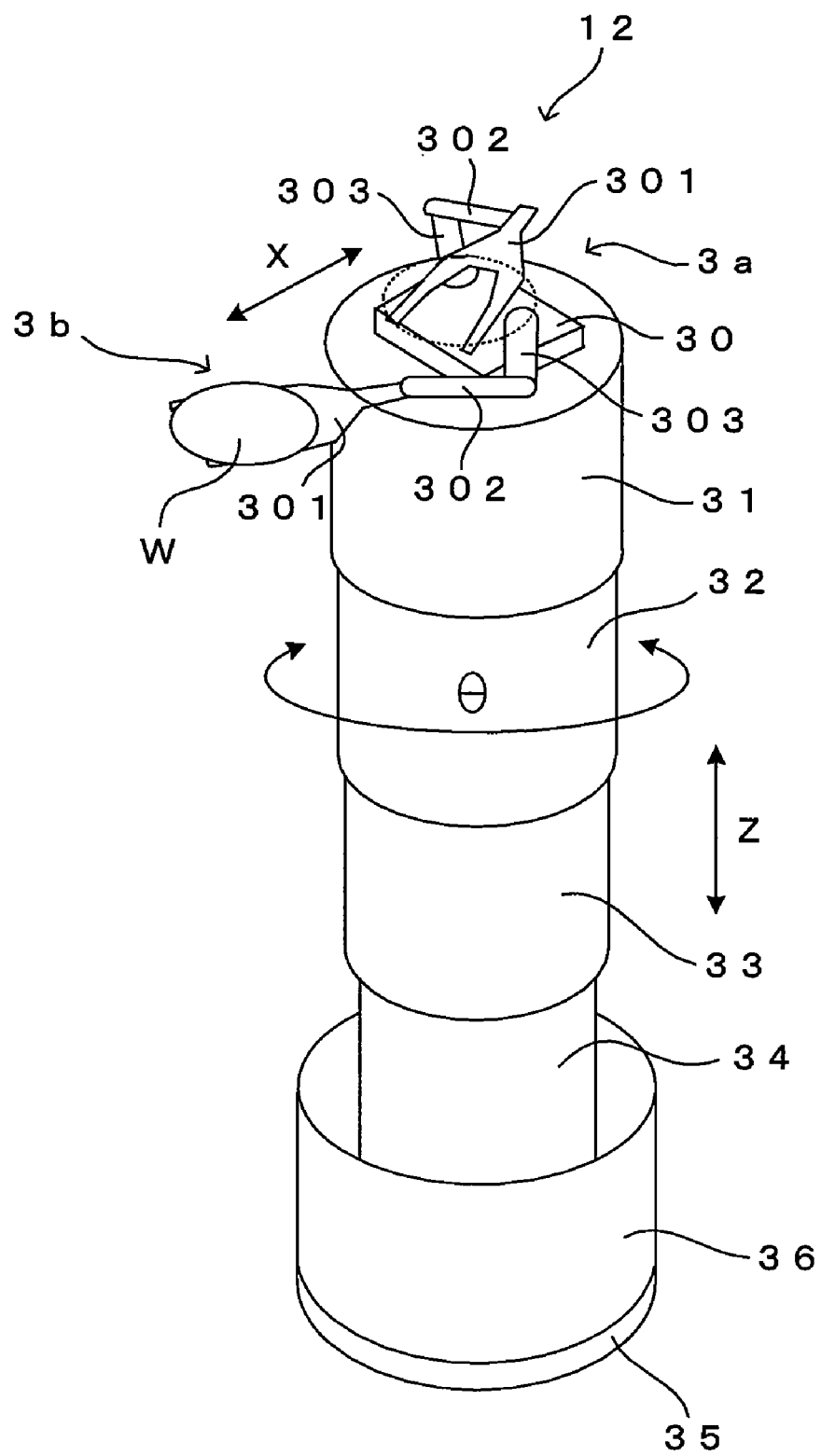
FIG. 4 is a perspective view which shows main parts of the substrate transport robot to be provided to the substrate processing apparatus of FIG. 1.

FIG. 4 is a perspective view which shows main parts of the substrate transport robot to be provided to the substrate processing apparatus of FIG. 1. This substrate transport robot 12 includes: a pair of substrate transport arms 3a, 3b; a horizontal transport mechanism for moving these substrate transport arms 3a, 3b independently from each other in horizontal direction (X direction); a telescopic elevating mechanism for moving these substrate transport arm 3a and 3b synchronized with each other in vertical direction (Z direction); and rotation drive mechanism for rotating these substrate transfer arms 3a, 3b about vertical axis. (θ direction).

The aforementioned telescopic elevating mechanism is a telescopic style, multi-layered nesting structure, capable of storing a cover 34 in a cover 33, a cover 33 in a cover 32 and a cover 32 in a cover 31. When the substrate transport arms 3a, 3b descend, the cover 34 is stored in the cover 33, so is the cover 33 in the cover 32 and the cover 32 in the cover 31. When the transport arms 3a, 3b ascend, the cover 34 is pulled out of the cover 33, so is the cover 33 out of the cover 32 and the cover 32 out of the cover 31. The aforementioned rotation drive mechanism is constructed in the structure to rotate the telescopic elevating mechanism about a base 35 in θ direction. The base 35 is provided with a cover 36.

The substrate transport arm 3a, 3b each includes a substrate retaining section 301, a first connecting member 302 and a second connecting member 303. Further, these first and second connecting members 302 and 303 are arranged to bend and stretch so that the substrate transport arm 301 moves forward in horizontal X direction. In this substrate transport arm 3a, the substrate retaining section 301 is displaced at its apical end for holding the substrate W. The substrate retaining section 301 is held by the first connecting member 302 horizontally rotatable. The substrate transport arm 3a further includes the horizontal transport mechanism which is equipped with a motor (not shown) for rotating the second connecting member 303 horizontally. The substrate transport arm 3b is in identical structure as the substrate transport arm 3a.

As described above, the substrate transport robot 12 is constructed to be capable of transporting the substrate W, which is retained at the substrate retaining section 301 to any of the processing units.

Further, the indexer robot 11 is different from the aforementioned substrate transport robot 12 only in the point that it includes a single substrate transport arm 3c, instead of the vertically paired substrate transport arms 3a and 3b of the aforementioned substrate transport robot 12. This indexer robot 11 is driven by the motor, which is not shown, to move back and forth along a guiding member 13, which is displaced along the indexer ID (FIG. 1).

Figure 5:
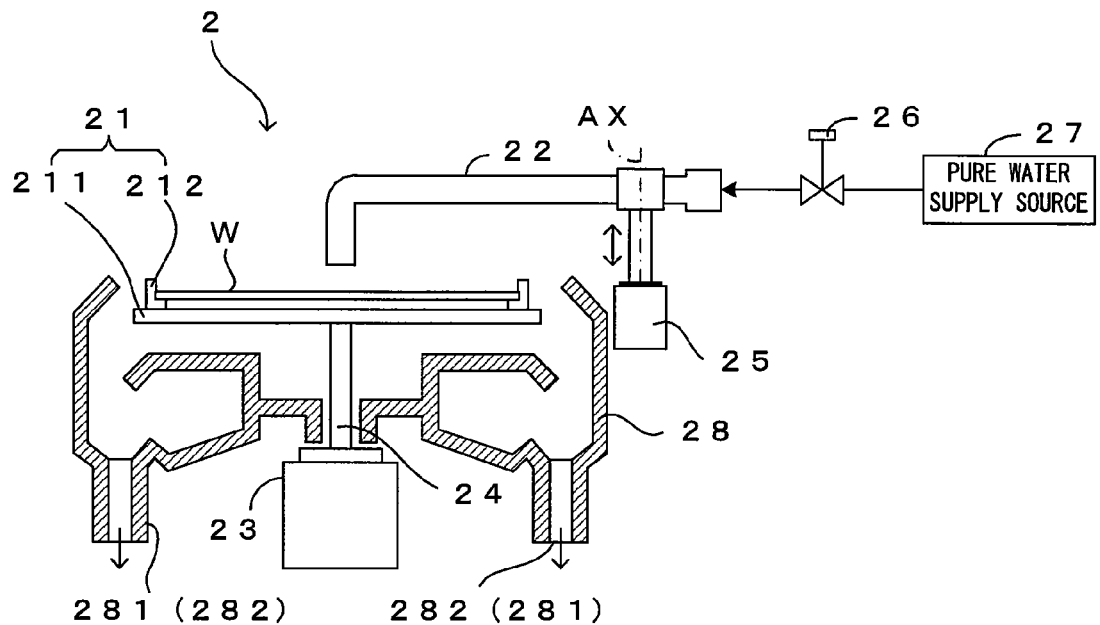
FIG. 5 is a drawing which shows the construction of the pre-processing unit, which is mounted to the substrate processing apparatus of FIG. 1

Now, referring to FIG. 5, the pre-processing unit will be described. FIG. 5 is a drawing which shows the construction of the pre-processing unit, which is mounted to the substrate processing apparatus of FIG. 1. Each pre-processing unit 2 includes: a spin chuck 21 (substrate retainer) for holding the substrate W horizontal and rotating, with its surface facing up; and a nozzle 22 as preprocessing liquid supplying means for supplying pure water as a preprocessing liquid toward the center of the top surface (surface) of the substrate W, which is held by the spin chuck 21. This spin chuck 21 includes a disc-shaped base member 211, which is substantially the same size in plan as that of the substrate W and a plurality of retaining members 212, which is fastened to the top surface of this base member 211. The substrate W can be retained approximately horizontal as the retaining members 212 supports the circumferential portion of the substrate W. While this embodiment mechanically retains the substrate W, the method for retaining the substrate is not limited to this. For instance, the substrate W may be retained by means of vacuum-sucking of its bottom surface.

Further, the base member 211 is connected with an output rotary shaft 24 of a motor 23 so that it rotates when the motor 23 is driven to rotation according to an operation command from the control unit 8. Consequently, the substrate W retained by the spin chuck 21 is driven into rotation about the center of the substrate W at a desired timing. Thus, according to this embodiment, the spin chuck 21 is equivalent to the "first retainer" of the present invention, and the motor 23, equivalent to the "first rotating section" of the present invention.

A nozzle 22 is disposed above the spin chuck 21 and capable of ejecting pure water as a preprocessing liquid toward the substrate W. Further, as indicated by the drawing, the proximal end of the nozzle 22 is connected with an elevating rotary mechanism 25 so that it can be driven to horizontally pivot about a rotation center AX and descend/ascend by the elevating rotary mechanism 25. A rear end of the nozzle 22 is connected with a pure water supplier 27 via a pure water supplier valve 26, so that the nozzle 22 can eject pure water when the pure water supplier valve 26 is kept open according to the open/control command from the control unit 8. Thus, according to this embodiment, the nozzle 22 functions as a "first processing nozzle".

Further, in this pre-processing unit 2, pure water removed from the substrate W, instead of remaining on the surface of the substrate W, as liquid film becomes a surplus. Therefore, for the purpose of retrieving this surplus pure water, a processing cup 28 is provided around the spin chuck 21. Further, the processing cup 28 is arranged to be capable of ascending/descending and is provided with drain ports 281 (282) and exhaust ports 282 (281) at their bottom.

Figure 6:
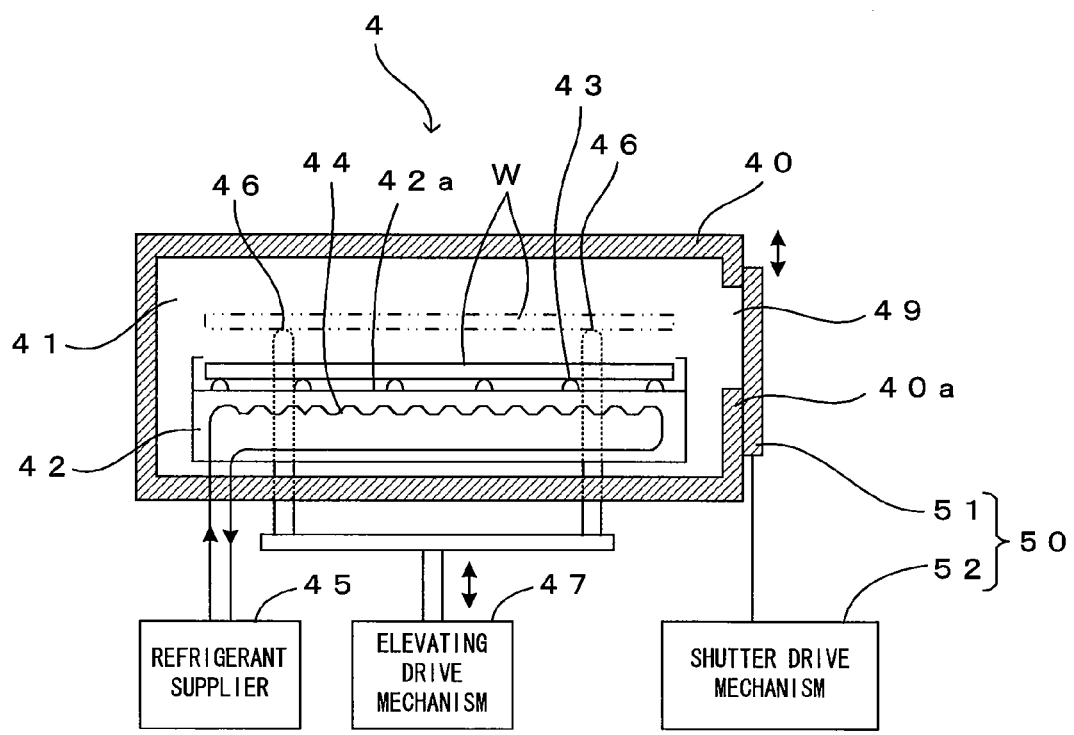
FIG. 6 is a drawing which shows a construction of the freezing process unit installed in the substrate processing apparatus of FIG. 1.

Next, a freezing treatment unit 4 will be described with reference to FIG. 6. FIG. 6 is a drawing which shows a construction of the freezing process unit installed in the substrate processing apparatus of FIG. 1. This freezing process unit 4 performs a freezing process of the liquid film formed on the surface of the substrate. The freezing process unit 4 includes a cooling plate 42 (substrate cooling section), which is made of quarts and is slightly larger than the substrate W, inside a processing chamber 41 (cooling process chamber), which is almost rectangular solid and partitioned by a partition wall 40. This cooling plate 42 includes a substrate cooling surface 42a, which is almost horizontal and is larger than the substrate W in plan. This substrate cooling surface 42a is provided with a plurality of spherical proximity balls 43 (supporting section) in a protruding condition. Inside the cooling plate 42 is a refrigerant path 44 formed almost in parallel with a substrate cooling surface 42a. The both ends of the refrigerant path 44 are connected with a refrigerant supplier 45. The refrigerant supplier 45 includes a cooling section for cooling a refrigerant and a pumping sections such as a pump, etc. for pumping the refrigerant to the refrigerant path 44 to circulate it inside the refrigerant path 44. Therefore, the refrigerant is supplied from the refrigerant supplier 45, while the refrigerant exiting from the refrigerant path 44 is returned to the refrigerant supplier 45. As for a refrigerant, any refrigerant is acceptable as long as it chills the substrate cooling surface 42a to the temperature lower than the freezing point of the preprocessing liquid.

Pluralities of lifts pins 46 are disposed so as to vertically pierce through the cooling plate 42. Further, these lift pins 46 and an elevating drive mechanism 47 such as an air cylinder or the like for moving up/down the lift pins constitute an approach/recede mechanism, which moves the substrate close to/away from the substrate cooling surface 42a. The lift pins 46 are capable of supporting the substrate W on their top ends and are ascended or descended when the elevating drive operates. Thus, the substrate W is positioned in height. For example, the substrate W is supported at the substrate loading/unloading height (the position indicated by two dotted dashed line) at which the substrate W is handed over to and from the substrate transport robot 12. Further, by evacuating the top ends of the lift pins 46 below the substrate cooling surface 42a of the cooling plate 42 (below the proximity ball 43 to be accurate), the substrate W supported by the lift pins 46 is placed on (on the proximity ball 43 to be accurate) the substrate cooling surface 42a (the position indicated by a solid line).

A substrate transit port 49 is disposed at the substrate loading/unloading height on a frontal partition wall 40a, which can be faced by the substrate transport robot 12. Further, a shutter mechanism 50 is provided for opening/closing the substrate transit port 49. This shutter mechanism 50 includes a shutter board 51 for blocking the substrate transit 49 and a shutter drive mechanism 52 for moving the shutter board 51. This shutter drive mechanism 52 moves the shutter board 51 between closed position wherein the substrate transit port 49 is blocked and opened position wherein the substrate transit port 49 is opened. When the substrate transit port 49 is opened with the shutter board 51 set at opening position, the substrate transport arm 3a, 3b of the substrate transport robot 12 enters the processing chamber 41 so as to hand over and receive the substrate W to and from the lift pins 46. Further the operations of the refrigerant supplier portion 45, the elevating drive mechanism 47 and the control unit 8 controls the shutter drive mechanism 52.

Figure 7:
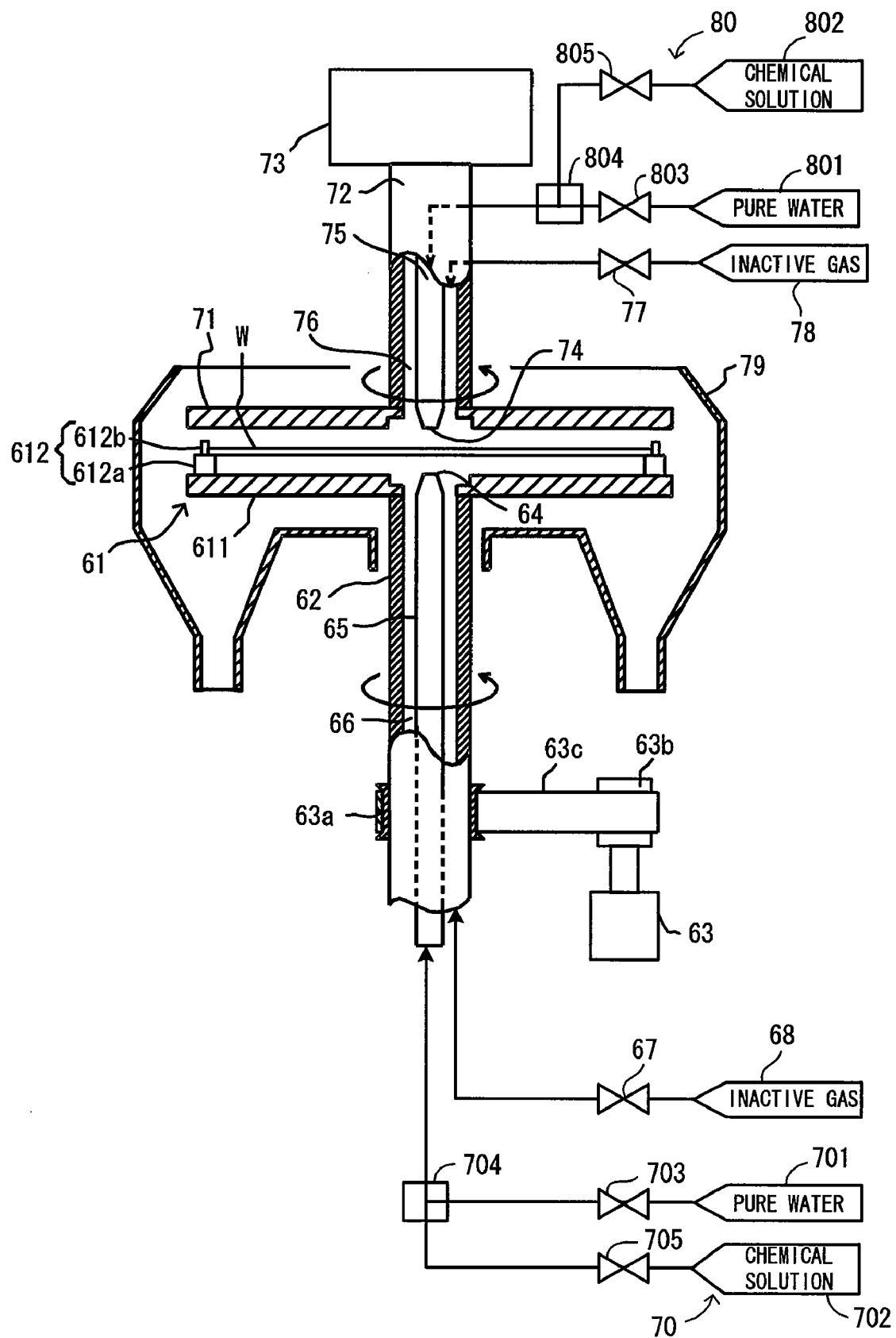
FIG. 7 is a drawing which shows the construction of a post-processing unit installed in the substrate processing apparatus of FIG. 1.

Next, the post-processing unit 6 is described, with reference to FIG. 7. FIG. 7 is a drawing showing the construction of the post-processing unit installed in the substrate processing apparatus of FIG. 1. This post-processing unit 6 performs the process of removing a frozen film on the substrate. In the unit 6, the post-processing liquid is supplied to both surfaces of the substrate W while a spin chuck 61 holds and spins the substrate W. The spin chuck 61 includes a disc shaped base member 611, functioning also as a blocking member for the bottom surface of the substrate and more than three retaining members 612 disposed above the base member 611. Each of these retaining members 612 includes: a supporting portion 612a for placing and holding the outer circumferential portion of the substrate W from underneath; and a regulating portion 612b for regulating the position of the outer circumferential edge of the substrate W. These retaining members 612 are disposed in the proximity of the outer circumferential portion of the base member 611. Each of the regulating portions 612b can be either in an active status for holding the substrate W by contacting the outer circumferential edge of the substrate W or in an inactive status for releasing the substrate W by retreating from the outer circumferential edge of the substrate W. The substrate W is loaded/unloaded to and from the supporting portion 612a by the substrate transport robot 12 during the inactive status. On the other hand, after the substrate W is placed on the supporting portion 612a with the top surface of the substrate W facing up, each of the regulating portions 612b is switched to the active status so that the substrate W is held by the spin chuck 61.

Further, the under surface of the base member 611 is connected with a top end of a hollow rotation spindle 62. A pulley 63a is fastened to the bottom end of the rotation spindle 62. The arrangement is made such that a rotation drive power of a motor 63 is conducted to the rotation spindle 62 via a belt 63c between the pulley 63a and pulley 63b, which is fastened to the rotation spindle of the motor 63. Thus, driving the motor 63 will drive the substrate W retained by the spin chuck 61 into rotation about the center of the substrate W. Therefore, according to this embodiment, the spin chuck 61 is equivalent to the "second retainer" of the present invention and the motor 63 is equivalent to the "second rotating section" of the present invention.

A nozzle 64 is placed at the center of the base member 611 as its fixed position, for functioning as a bottom side processing nozzle of the present invention. A processing liquid supply pipe 65 is inserted to the hollow rotation spindle 62 and has a top end on which the nozzle 64 is connected. The processing liquid supply pipe 65 is connected to a liquid supply section 70, which supplies the post-processing liquid, thereby enabling the nozzle 64 to eject post-processing liquid when the post-processing liquid is supplied from the liquid supplying section 70. Construction of the liquid supply section 70 will be described hereinafter in detail.

Further, a space between the internal surface of the rotation spindle 62 and the external surface of the processing liquid supply pipe 65 constitutes a cylinder shaped gas supply path 66. This gas supply path 66 is connected to a gas supply section 68 via a valve 67, so as to supply nitrogen gas to a space created between the base member 611 as a blocking member and the bottom surface of the substrate W. Although nitrogen gas is supplied form the gas supply section 68 in this embodiment, the arrangement can be made to supply air and other inactive gases.

A blocking member 71 is disposed above the spin chuck 61. This blocking member is disposed at the bottom end of a suspension arm 72, which is placed in vertical direction. Further, a motor 73 is disposed on the top end of this suspension arm, thereby enabling the blocking member 71 to rotates about the center of the suspension arm 72 when the motor 73 drives. Further, the rotation axis of the rotation spindle 62 of the spin chuck 61 is aligned with the rotation axis of the suspension arm 72, so that the spin chuck 61 functioning as a blocking member, the substrate W retained by the spin chuck 61 and the blocking member 71 rotate about the spindle. Further, the motor 73 is arranged to rotate the blocking member 71 in the same direction and at approximately the same rotation speed as those of the spin chuck 61 (the substrate retained thereby).

The central portion of the blocking member 71 is provided with a nozzle 74, which function as a second processing nozzle of the invention. A processing liquid supply pipe 75 is inserted to the hollow suspension arm 72 with a nozzle 74 bonded to the bottom end of the suspension arm 72. The processing liquid supply pipe 75 is connected with a liquid supply section 80, which supply the post-processing liquid, thereby enabling the nozzle 74 to eject the post-processing liquid when the post-processing liquid is supplied from the liquid supply portion 80. Construction of the liquid supply portion 80 will be described hereinafter in detail.

Further, a space between the internal surface of the suspension arm 72 and the external surface of the processing liquid supply pipe 75 constitutes a cylinder shaped gas supply path 76. This gas supply path 76 is connected with a gas supply section 78 via a valve 77, so as to supply nitrogen gas to a space created between the blocking member 71 and the top surface of the substrate W.

Further, the spin chuck 61 is provided with a cup 79 around it to prevent the processing liquid from splashing to the surrounding area. The processing liquid retrieved by the cup 79 is discharged to outside of the apparatus to be stored in the tank (not shown) disposed below the cup 79.

Next, construction of the liquid supply sections 70 and 80 will be described. Since the liquid supply sections 70 and 80 are arranged in identical manner, only the arrangement for the liquid supply section 70 is described here, while the components of the other liquid supply section 80 are represented by equivalent reference characters respectively and the description thereof is dispensed with. This liquid supply section 70 includes a pure water supply section 701 for supplying pure water and a chemical solution supply section 702 for supplying chemical solution. In case that only pure water needs to be supplied and chemical solution is not needed for the post-processing liquid, the chemical solution supply section 702 becomes unnecessary.

Further, while the pure water supply section 701 is connected with a mixing unit 704 via a valve 703, the chemical solution supply section 702 is connected with the mixing unit 704 via a valve 705. Switching the valve 703 and 705 to open/close in accordance with the controlling command from the control unit 8 enables the mixing unit 704 to selectively supply pure water or chemical solution toward the bottom surface of the substrate W. To be more specific, when both of the open/close valve 703 and 705 is opened, chemical solution and pure water are supplied to the mixing unit 704 to prepare a cleaning solution with a pre-determined concentration. For such cleaning solution, in order to control an etching amount on the substrate (etched film thickness) to 1 angstrom or less, preferably less than 0.4 angstrom, for instance, alkaline solution made of highly diluted ammonia (1% or less) is used. If multiple types of chemical solutions are used, a chemical solution supply section of the identical structure can be provided for each type of solution.

Next, the operation of the substrate processing apparatus arranged in a foregoing manner will be described in detail with reference to FIG. 8. FIG. 8 is a flowchart showing the operation of the substrate processing apparatus of FIG. 1. It should be noted that the description here focuses on a single substrate W to facilitate easy understanding of the operation.

An unprocessed substrate W stored in the cassette C is unloaded by the indexer robot 11 (Step S1), then handed over directly to the substrate transport robot 12. Thus, the unprocessed substrate W is loaded to the substrate processing section PS. Upon receiving the unprocessed substrate W, the substrate transport robot 12 moves to the front of the pre-processing unit 2 (one of the two pre-processing units) to load the substrate W to the pre-processing unit 2 (Step S2). The spin chuck 21 retains the substrate W loaded to the pre-processing unit 2, while the spin chuck 21 is driven into rotation by the motor 23 and pure water is supplied from the nozzle 23 as pre-processing liquid to the surface of the substrate W. The pure water supplied to the surface of the substrate W spreads to the entire surface through centrifugal power generated by the rotation of the substrate W, while part of it is spin drained to the outside of the substrate W. As a result, the entire surface of the substrate W is coated with pure water, so that a liquid film (aqueous film) of a pre-determined thickness is formed (Step S3; Liquid film forming step).

Thickness of the liquid film remaining on the surface of the substrate W can be set discretionally in accordance with contaminants, such as particles and the like to be removed. For example, it is also possible to set the thickness of the liquid film remaining on the surface of the substrate W based on the sizes of the particles subjected to be removed and adjust it to be lower than the size or greater than the size. Although the contaminants with the size of 0.06 µm and over is currently set as a scope of management, the actual size of the contaminants to be removed ranges broadly from less than 0.06 µm to several µm. Therefore, in the event that the thickness of the film is adjusted to be equal or greater than the size of the contaminants to be removed, in order to remove contaminants effectively from the substrate W, it is desirable to have liquid film, which is at least several 10 µm thick or preferably several 100 µm thick remain on the surface.

Upon completion of the liquid film forming process in the pre-processing unit 2, the substrate W is transported by the substrate transport robot 12 from the pre-processing unit 2 to freeze processing unit 4 (either pre-processing unit 2 or freeze processing unit 4 that is stacked in multiple layers above the post-processing unit 6) within the apparatus, before the liquid film formed on the substrate dries out (Step S4; First transport step). Specifically, while the substrate W with liquid film formed on its surface is retained by the substrate transport arm 3a (or 3b), the substrate W is unloaded from the pre-processing unit 2, then, loaded to the processing chamber 41 of the freeze processing unit 4 and placed on the lift pins 46. The control unit 8 controls the transport time to ensure that the transportation of the substrate W is completed within the time limit. Transporting the substrate W in a foregoing manner will ensure precise control of the thickness of the liquid film remaining on the surface of the substrate W, while preventing the liquid film from drying out. Further, during this process, the shutter board 51 is lifted to keep the substrate passage port 49 open, as well as keeping the lift pins 46 raised.

Subsequently, the control unit 8 controls the elevating drive mechanism 47 to lower the lift pin 46 as well as lowering the shutter board 51 to shut, so that the substrate W is moved close to the substrate cooling surface 42 and placed on the proximity ball 43. As a consequence, while the bottom surface of the substrate W becomes abutted on and supported by the proximity ball 43, the substrate W is placed opposed and close to the substrate cooling surface 42a, with marginal space kept between the substrate W and the substrate cooling surface 42a. Therefore, in the condition that the substrate W is supported by the proximity ball 43 and placed close to the substrate cooling surface 42a, the substrate W is cooled from its bottom surface side by means of cooling power conductivity from the substrate cooling surface 42a. As a result, the liquid film adhering to the surface of the substrate is frozen (Step S5; Freezing step).

With an expansion of liquid film (when water at 0° C. becomes an ice at 0° C., its cubic volume increases by 1.1 times), the contaminants adhering to the substrate W migrate a marginal distance from the surface of the substrate W. This means, as the volume of liquid film entering the space between the surface of the substrate and contaminants expands, contaminants move away from the surface of the substrate by a marginal distance. As a result, adhesiveness between the substrate W and contaminants decreases, thereby causing the contaminants to detach from the surface of the substrate W. Therefore, the contaminants adhering to the surface of the substrates become readily removable when the post-processing liquid is supplied to the substrate in the post-processing unit 6, which will be described hereinafter in detail. Moreover, whereas the processing liquid (pure water) enters between the contaminants and the substrate W, since device patterns formed on the surface of the substrate is integrated with the substrate as one unit, processing liquid does not enter between the patterns and the substrate base. Therefore, only the contaminants can be selectively prioritized for removal from the substrate without peeling or destroying the patterns.

Upon the passage of predetermined time and completion of the freezing of liquid film, the control unit 8 controls the elevating drive mechanism 47 to lifts the lift pins 46 and guides the substrate W to the substrate loading/unloading height. Then, the shutter board 51 is opened and the substrate W with frozen liquid film is handed over to the substrate transport robot 12 through the substrate passage port 49. Then, the substrate transfer robot 12 transports the substrate W with frozen liquid film from freeze processing unit 4 to post-processing unit 6 (either one of the two post-processing units 6) within the apparatus (Step S6; Second transport step). Here, the transport timing from the freeze processing unit 4 to the post-processing unit 6 is discretionary as long as the process is not left unattended. This means that the substrate W can be transported after the frozen film melts or the transportation of the substrate W can be completed before the frozen film melts. However, transporting the substrate W in the manner of the latter securely prevents the detached contaminants from re-adhering to the substrate W. Therefore, it is desirable for the control unit 8 to control the transport time to ensure that the substrate transport robot 12 completes the transportation of the substrate W before the frozen film melts.

Here, the usage of the substrate transport arms 3a, 3b can be differentiated between the substrate transport from the pre-processing unit 2 to the freeze processing unit 4 and the substrate transport from the freeze processing unit 4 to the post-processing unit 6. This is because that the first substrate transport is performed when the substrate is wet with liquid (pure water) and the latter substrate transport is done when the liquid is frozen to become a frozen film (ice film). Therefore, using each of the substrate transport arms dedicatedly for either one of the substrate transports ensures the transportation of the substrate W in good condition. That is, using the substrate transport arm wet with the liquid for the substrate transport from the freeze processing unit 4 to post-processing unit 6 can be avoided, therefore melting of the frozen film is prevented.

When the substrate W with frozen film is loaded to the post-processing unit 6 by the substrate transport robot 12, the substrate W is retained by the spin chuck 61 and the blocking member 71 is placed close to the surface of the substrate W. Then, with the substrate W placed between the base member 611 and the blocking member 71, the motor 63 is driven to rotate the substrate W together with the spin chuck 61. In the case that the cleaning solution, which is a mixture of chemical solution and pure water with the predetermined concentration, is used as a post-processing liquid, all of the open/close valves 703, 705, 803 and 805 are opened to supply chemical solution and pure water to mixing units 704 and 804, so that the cleaning solution is prepared at predetermined concentration and is pumped to the nozzle 64 and 74. Then, the nozzles 64 and 74 start supplying the cleaning solution to the both surfaces of the substrate W.

Consequently, the frozen film on the surface of the substrate is melted by the cleaning solution. And the centrifugal force driven by the rotation of the substrate W works on the frozen film and the cleaning solution supplied to the surface of the substrate. Hence, the frozen film including the contaminants is removed from the surface of the substrate and easily drained to outside of the substrate (Step S7; Film removal step). Specifically, the adhesion of the contaminants to the substrate W is reduced as a result of freezing process, then is washed over by the cleaning solution while its flow rate is accelerated by the centrifugal force, consequently the contaminants are removed from the substrate W, easily. Therefore, the contaminants can be removed from the substrate W without damaging the patterns formed on the surface of the substrate W. In this case, it is not necessary to raise the temperature of the spin chuck 61 higher than room temperature for the purpose of melting the frozen film on the surface of the substrate.

Further, the rotation of the substrate W makes the cleaning solution spread to the entire bottom surface of the substrate W, allowing the bottom surface of the substrate W to be cleaned as well. Therefore, the contaminants can be removed not only from the top surface of the substrate but also from the entire substrate.

Moreover, in the case that the substrate W is processed only by using the pure water as a post-processing liquid, both surfaces of the substrate can be processed with pure water by opening the open/close valves 703, 803 and pump the pure water to the nozzles 64, 74.

Once the film removal process is completed, all the open/close valves 703, 705, 803 and 805 are closed to stop the supply of cleaning solution from the nozzles 64, 74 to the substrate W. Thereafter, the cleaning solution is shaken off and drained to the outside of the apparatus by means of the rotation of the substrate W. Once the draining of the cleaning solution is completed, the control unit 8 increases the rotation speed of the motor 63 to spin the substrate W at high speed (Step S8). Further, the motor 73 is driven to rotate the blocking member 71 at high speed to be in sync with the rotation of the substrate W. This completely drains off the liquid substance adhering to the substrate W and the blocking member 71. At this time, nitrogen gas is supplied from the gas supply paths 66 and 76 to supply nitrogen gas to both surfaces of the substrate W. This accelerates drying of both surfaces of the substrate W.

Upon completion of a series of cleaning processes (liquid film forming process+freezing process+film removal process), the blocking member 71 is separated from the surface of the substrate W retained by the spin chuck 61, and the substrate is released from the retention of the retaining member 612. Thereafter, the substrate transport robot 12 unloads the processed substrate W from the post-processing unit 6. Then, unloading operation is performed with the reverse sequences of the loading process, so as to hand over the processed substrate W to the indexer robot 11 to be stored in the cassette C (Step S9).

According to the embodiment as described above, the pre-processing unit 2, the freeze processing unit 4 and the post-processing unit 6 are installed apart from each other in the apparatus. Further, in the apparatus, the cleaning processes (liquid film forming process+freezing process+film removal process) are performed as the substrate transport robot 12 transport the substrate W from the pre-processing unit 2 to the freeze processing unit 4, and from freeze processing unit 4 to post-processing unit 6. Thus, the freeze-processing unit 4 dedicatedly performs freezing process, cold energy is never retained in either pre-processing unit 2 or post-processing unit 6. Therefore, when the frozen film is removed from the substrate W, the contaminants adhering to the substrate W can promptly be removed together with the frozen film. Specifically, due to the absence of cold energy in the spin chuck 61 which is installed in the post-processing unit 6, the contaminants adhering to the substrate W can be removed speedily by thawing the frozen film without having to raise the temperature of the spin chuck 61 higher than necessary.

Moreover, according to this embodiment, even in the case that freezing process and film removing process are performed repeatedly for a plurality of the substrates W, only the substrate W's temperature is required to be reduced for freezing process, and by the same token, only the substrate W's temperature is required to be increased (thawed) for film removing process. Thus, there is no need for lowering/increasing the temperature of the retaining members including spin chucks and the like. This results in significant reduction in the processing time at each processing unit, as well as significant improvement in energy efficiency compared with the case that the cleaning process is performed within the same processing unit.

Further, according to this embodiment, the arrangement is made for the substrate W to be transported between the pre-processing unit 2 and the freeze processing unit 4, and between freeze processing unit 4 and post-processing unit 6. This allows that the time required for transportation is managed easily and that each parameter for cleaning process can be controlled accurately. That is, the control unit 8 for controlling the entire apparatus is capable of controlling the transportation time by the substrate transport robot 12 and the cleaning parameters at each of the processing units (processing time by the processing liquid, freezing time, etc.), while keeping each of the processing units handling the cleaning processes (liquid film forming process+freezing process+film removal process) apart within the apparatus. Therefore, a sequence of cleaning processes can be performed efficiently and accurately, delivering great substrate W cleaning result at reduced processing time.

With regard to the transportation of the substrate W in particular, by transporting the substrate W from the pre-processing unit 2 to the freeze processing unit 4 before the liquid film formed on the surface of the substrate dries out. Consequently, the residual liquid amount (liquid film thickness) to be frozen on the surface of the substrate can be controlled accurately. Further, the apparatus performs the transportation of the substrate W from the freeze processing unit 4 to post-processing unit 6 before frozen film melts. This securely prevents the contaminants, which is detached once from the substrate W via freezing process, from re-adhering to the substrate W, resulting in improved contaminant removal rate.

Further, according to this embodiment, while the substrate W is supported by the proximity ball 43 (supporting section), the substrate cooling surface 42*a*, with its surface temperature lower than the freezing point, is placed close to the substrate W in opposing position so as to freeze the liquid film formed on the surface of the substrate. Therefore, following advantage is delivered in comparison with the arrangement wherein the retainer such as spin chuck, etc. and the cooling section, which cool the substrate by supplying chilling gas, etc. to the substrate are located within the same processing unit (processing chamber). That is, the liquid film on the substrate is completely frozen at good quality, without negative effect on the substrate nor troubles such as deficiency in retaining functions, etc. resulting from the deposition of ice film (ice fragments) on the retainer, after repeated execution of freeze process.

Further, in the event of freezing of the entire substrate, it is necessary to clean not only the top surface of the substrate but also the bottom surface of the substrate, i.e. both surfaces of the substrate. Cleaning the entire substrate in the same processing unit demands disposing the liquid supply section such as nozzle as well as the cooling section, opposing to the bottom surface (bottom surface) of the substrate W. This causes even the liquid supply section to be chilled after repeated executions of the freezing process, thereby causing the risk of deficient liquid supply to the substrate. A potential solution is to keep the liquid supply section close to the bottom surface of the substrate W during film removing process, while keeping the liquid supply section away from the bottom surface of the substrate W during freezing process. However, it is in reality very difficult to adopt such an arrangement.

On the other hand, according to the present invention, the pre-processing unit 2 and the post-processing unit 6 are disposed separately from the freezing processing unit 4. Therefore, aforementioned problem will not happen to the nozzles of the pre-processing unit 2 and the post-processing unit 6. Therefore, at the post-processing unit 6, the nozzles supplying the processing liquid to the bottom of the substrate W can be displaced facing the bottom surface of the substrate W as its fixed position. Of course, even if the nozzle is placed opposing to the bottom surface of the substrate W as described herein, ejection of processing liquid will not be hampered. Therefore, it becomes possible to clean not only the top surface of the substrate, but also both surfaces of the substrate.

The invention is not limited to the embodiment above but may be modified to the extent not deviating from the invention of the intention. For instance, in the embodiment above, the pre-processing unit 2 and post-processing unit 6 are constructed differently, with one of the processing units dedicated to handle liquid film forming process and the other dedicated to film removing process. However, by unifying the preprocessing liquid and the post-processing liquid, structure of the units can be unified so as to allow a single processing unit to execute both liquid film forming process and film removal process. In this case, the processing unit, which executes the film forming process, can be made to also execute the film removal process, by having the substrate transport robot 12 transports the substrate W, which is finished with freezing process to the processing unit. Even with this construction, the same effect as the embodiment described above will be obtained as the processing unit, which executes both liquid film forming process and film removal process does not retain cool energy.

Moreover, the embodiment described above requires the pre-processing unit 2 to form liquid film by applying the preprocessing liquid to the surface of the substrate, while rotating the substrate W. However, the construction of the pre-processing unit 2 is not limited to this. For instance, as shown by FIG. 9, construction of pre-processing unit can be more simplified so as to reduce cost of the apparatus. It is also possible for the liquid film to be formed on the surface of the substrate without having the substrate W rotate.

FIG. 9 is a drawing which shows variation of the pre-processing unit to be included in the substrate processing apparatus related to the invention. A pre-processing unit 20 includes: a slit nozzle 92 for supplying pure water as a pre-processing liquid to the substrate W, which is mounted on a base 91; and a horizontal drive mechanism 93 for driving the slit nozzle 92 horizontally. The slit nozzle 92 includes an ejection slit, which has the same length as the diameter of the substrate W and is connected with a pure water supply source 94 via a valve 93. Further, the horizontal drive mechanism 93 consists of a motor 931, a pulley 932 and a belt 933. A motor shaft of the motor 931 is coupled to the pulley 932, whereas the belt 933 is entrained about the pulley 932. That is, the belt 933 is arranged to run in cycles in conjunction with the rotation of the motor 931. Further, the slit nozzle 92 is supported by an arm 95, while the arm 95 and the belt 933 are interconnected via a lock member 96. In association with the normal or reversal rotation of the motor 931, the slit nozzle 124 supported by the arm 95 is moved in the (+x) or (−x) direction.

With the construction described above, while pure water is dripped from the slit nozzle 92 onto the substrate W by keeping the valve 93 open, the horizontal drive mechanism 93 is used so as to move the slit nozzle 92 in parallel with the substrate W in the (+x) direction, so that the pure water is applied to the entire surface of the substrate W. Thus, adopting such a construction enables easy forming of the liquid film on the surface of the substrate.

The present invention can be applied to the substrate processing apparatus, which performs cleaning process for all types of the substrates including, semiconductor wafers, substrates for liquid crystal display, substrates for plasma display, substrates for FED (Field Emission Display), optical disc substrates, magnetic optical disc substrates, substrates for photo masks and the like.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing apparatus for cleaning a to-be-processed surface of a substrate, the apparatus comprising:
   a pre-processing unit, including a first retainer, which retains the substrate directly by the first retainer and applies a preprocessing liquid to form a liquid film of the preprocessing liquid on the to-be-processed surface;
   a freeze processing unit which is disposed away from the pre-processing unit and freezes the liquid film formed on the to-be-processed surface of the substrate;
   a post-processing unit, including a second retainer and a first rotating section which rotates the substrate retained directly by the second retainer, which is disposed away from both of the pre-processing unit and the freeze processing unit, supplies a post-processing liquid to the frozen liquid film to remove the liquid film from the to-be-processed surface of the substrate and subsequently rotates the substrate to dry out; and
   a transport unit, including a third retainer, wherein the transport unit transports the substrate from the pre-processing unit to the freeze processing unit with the substrate retained directly by the third retainer; and transports the substrate from the freeze processing unit to the post-processing unit with the substrate retained directly by the third retainer,
   wherein the top surface of the substrate is the to-be-processed surface, and the freeze processing unit includes:
   a substrate cooling section having a substrate cooling surface with a surface temperature lower than the freezing point of the preprocessing liquid, and which cools the substrate while disposing the substrate cooling surface close to the substrate in opposing position; and
   a supporting section which supports the substrate by abutting on the bottom surface of the substrate so as to dispose the substrate and the substrate cooling section away from each other.

2. The substrate processing apparatus of claim 1, wherein the freeze processing unit is disposed above the pre-processing unit or the post-processing unit.

3. The substrate processing apparatus of claim 2, wherein the freeze processing unit includes a plurality of freeze processing units, and
   the transport unit transports the substrate coated with the liquid film selectively to one of the plurality of freeze processing units.

4. The substrate processing units of claim 3, wherein the plurality of freeze processing units are stacked in multi-layers.

5. The substrate processing apparatus of claim 1, wherein the pre-processing unit includes:
   a second rotating section which rotates the substrate retained by the first retainer; and
   a first processing nozzle which supplies the preprocessing liquid to the top surface of the substrate rotated by the second rotating section.

6. The substrate processing apparatus of claim 1, wherein the pre-processing unit includes:
   a slit nozzle which has an ejection slit with its length greater than the diameter of the substrate and supplies the preprocessing liquid to the top surface of the substrate rotated by the first rotating section; and
   a horizontal drive mechanism which horizontally moves the slit nozzle relative to the substrate.

7. The substrate processing apparatus of claim 1, wherein the post-processing unit includes
   a second processing nozzle which supplies the post-processing liquid to the top surface of the substrate rotated by the first rotating section.

8. The substrate processing apparatus of claim 7, wherein the post-processing unit further includes a bottom side processing nozzle which supplies the post-processing liquid to the bottom surface of the substrate rotated by the first rotating section.

9. A substrate processing method of cleaning a to-be-processed of a substrate, the method comprising:
   a liquid film forming step of applying a preprocessing liquid to the to-be-processed surface of the substrate, with said substrate being retained directly by a first retainer in a pre-processing unit, so as to form a liquid film of the preprocessing liquid on the to-be-processed surface;
   a first transport step of transporting the substrate having the liquid film to a freeze-processing unit which is disposed away from the pre-processing unit;
   a freezing step of freezing the liquid film in the freeze processing unit;
   wherein the top surface of the substrate is the to-be-processed surface, and the freeze processing unit includes:
   a substrate cooling section which has a substrate cooling surface whose a surface temperature is lower than the freezing point of the preprocessing liquid, and cools the substrate while disposing the substrate cooling surface close to the substrate in opposing position; and
   a supporting section which supports the substrate by abutting on the bottom surface of the substrate so as to dispose the substrate and the substrate cooling section away from each other;
   a second transport step of transporting the substrate having the liquid film frozen by the freeze processing unit to a post-processing unit which is disposed away from the pre-processing unit and the freeze processing unit, said substrate being retained directly by a second retainer in the post-processing unit; and a film removal step of removing the frozen liquid film by rotating the substrate retained directly by the second retainer, supplying a post-processing liquid to the to-be-processed surface of the substrate in the post-processing unit, thereby removing the liquid film from the to-be-processed surface of the substrate, and subsequently rotating the substrate to dry out;

wherein said first and second transport steps are carried out by a transport unit wherein said substrate is retained directly by a third retainer during said first and second transport steps.

10. The substrate processing method of claim 9, wherein the first transport step is of transporting the substrate from the pre-processing unit to the freeze processing unit before the liquid film formed on the to-be-processed surface of the substrate dries out.

11. The substrate processing method of claim 9, wherein the second transport step is of transporting the substrate from the freeze processing unit to the post-processing unit before the frozen film liquid melts.

* * * * *